US008570806B2

(12) United States Patent
Lee

(10) Patent No.: US 8,570,806 B2
(45) Date of Patent: Oct. 29, 2013

(54) Z-DIRECTION DECODING FOR THREE DIMENSIONAL MEMORY ARRAY

(75) Inventor: Guanru Lee, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 147 days.

(21) Appl. No.: 13/324,708

(22) Filed: Dec. 13, 2011

(65) Prior Publication Data

US 2013/0148427 A1    Jun. 13, 2013

(51) Int. Cl.
*G11C 16/04*    (2006.01)

(52) U.S. Cl.
USPC ............................... 365/185.17; 365/185.24

(58) Field of Classification Search
USPC ......................... 365/185.17, 185.24
See application file for complete search history.

(56) References Cited

U.S. PATENT DOCUMENTS

| | | | |
|---|---|---|---|
| 6,034,882 A | 3/2000 | Johnson et al. | |
| 6,115,287 A * | 9/2000 | Shimizu et al. | 365/185.17 |
| 6,906,361 B2 | 6/2005 | Zhang | |
| 6,906,940 B1 | 6/2005 | Lue | |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,274,594 B2 | 9/2007 | Pascucci et al. | |
| 7,315,474 B2 | 1/2008 | Lue | |
| 7,382,647 B1 | 6/2008 | Gopalakrishnan | |
| 7,420,242 B2 | 9/2008 | Lung | |
| 7,851,849 B2 | 12/2010 | Kiyotoshi | |
| 2005/0280061 A1 | 12/2005 | Lee | |
| 2007/0140001 A1 | 6/2007 | Motoi et al. | |
| 2008/0073635 A1 | 3/2008 | Kiyotoshi et al. | |
| 2008/0096327 A1 | 4/2008 | Lee et al. | |
| 2008/0101109 A1 | 5/2008 | Haring-Bolivar et al. | |
| 2008/0180994 A1 | 7/2008 | Katsumata et al. | |
| 2008/0247230 A1 | 10/2008 | Lee et al. | |
| 2008/0285350 A1 | 11/2008 | Yeh | |
| 2009/0097321 A1 | 4/2009 | Kim et al. | |
| 2009/0184360 A1 | 7/2009 | Jin et al. | |
| 2010/0226195 A1 | 9/2010 | Lue | |
| 2010/0270593 A1 | 10/2010 | Lung et al. | |
| 2011/0235421 A1* | 9/2011 | Itagaki et al. ............ 365/185.17 |

FOREIGN PATENT DOCUMENTS

EP    1936681 A1    6/2008
EP    2048709 A2    4/2009

OTHER PUBLICATIONS

Soon-Moon Jung et al. "Three Dimensionally Stacked NAND Flash Memory Technology Using Stacking Single Crystal Si Layers on ILD and TANOS Structure for Beyond 30nm Node," Electron Devices Meeting, 2006, IEDM International, Dec. 11-13, 2006, pp. 1-4.

Jiyoung Kim et al., Novel 3-D Structure for Ultra High Density Flash Memory with VRAT (Vertical-Recess-Array-Transistor) and PIPE (Planarized Integration on the same PlanE), 2008 Symposium on VLSI Technology Digest of Technical Papers, pp. 122-123.

(Continued)

*Primary Examiner* — Huan Hoang
(74) *Attorney, Agent, or Firm* — Kenta Suzue; Haynes Beffel & Wolfeld LLP

(57) ABSTRACT

The switch transistors in the NAND strings have combinations of threshold voltage levels that vary across the levels of a three dimensional memory array. A bias arrangement is applied to the select lines electrically coupled to the switch transistors. The NAND strings on a particular level of a three dimensional memory array are selected. The NAND strings on other levels are deselected.

20 Claims, 10 Drawing Sheets

(56) References Cited

OTHER PUBLICATIONS

Mark Johnson et al. "512-Mb PROM With a Three-Dimensional Array of Diode/Antifuse Memory Cells," IEEE Journal of Solid-State Circuits, vol. 38, No. 11, Nov. 2003, pp. 1920-1928.

Erh-Kun Lai et al. "A Multi-Layer Stackable Thin-Film Transistor (TFT) NAND-Type Flash Memory," 2006 IEEE, pp. 1-4.

H. Tanaka et al. "Bit Cost Scalable Technology with Punch and Plug Process for Ultra High Density Flash Memory," Jun. 12-14, 2007, Symposium on VLSI Technology Digest of Technical Papers, pp. 14-15.

Tzu-Hsuan Hsu et al. "Study of Sub-30nm Thin Film Transistor (TFT) Charge-Trapping (CT) Devices for 3D NAND Flash Application," IEEE 2009, pp. 27.4.1-27.4.4.

A. Hubert et al. "A Stacked SONOS Technology, Up to 4 Levels and 6nm Crystalline Nanowires, With Gate-All-Around or Independent Gates (Flash), Suitable for Full 3D Integration," IEDM 2009, pp. 27.6.1-27.6.4.

Hang-Ting Lue et al. "A Novel Buried-Channel FinFET BE-SONOS NAND Flash with Improved Memory Window and Cycling Endurance," 2009 Symposium on VLSI Technology Digest of Technical Papers, pp. 224-225.

Wonjoo Kim et al. "Multi-Layered Vertical Gate NAND Flash Overcoming Stacking Limit for Terabit Density Storage," 2009 Symposium on VLSI Technology Digest of Technical Papers, pp. 188-189.

Jaehoon Jang et al. "Vertical Cell Array Using TCAT (Terabit Cell Array Transistor) Technology for Ultra High Density NAND Flash Memory," 2009 Symposium on VLSI Technology Digest of Technical Papers, pp. 192-193.

Ryota Katsumata et al. "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Bipul C. Paul et al. "Impact of a Process Variation on Nanowire and Nanotube Device Performance," IEEE Transactions on Electron Devices, vol. 54, No. 9, Sep. 2007, pp. 2369-2376.

Sung-Jin Choi et al. "Performance Breakthrough in NOR Flash Memory With Dopant-Segregated Schottky-Barrier (DSSB) SONOS Devices," 2009 Symposium on VLSI Technology Digest of Technical Papers, pp. 222-223.

Sheng-Chih Lai et al. "Highly Reliable MA BE-SONOS (Metal-Al2O3 Bandgap Engineered SONOS) Using a SiO2 Buffer Layer," VLSI Technology, Systems and Applications 2008, VLSI-TSA International Symposium on Apr. 21-23, 2008, pp. 58-59.

Yoshiaki Fukuzumi et al. "Optimal Integration and Characteristics of Vertical Array Devices for Ultra-High Density, Bit-Cost Scalable Flash Memory," IEEE 2007, pp. 449-452.

Jiyoung Kim et al. "Novel Vertical-Stacked-Array-Transistor (VSAT) for Ultra-High-Density and Cost-Effective NAND Flash Memory Devices and SSD (Solid State Drive)", 2009 Symposium on VLSI Technology Digest of Technical Papers, pp. 186-187.

* cited by examiner

| Layer | 1 | 2 | 3 | 4 |
|---|---|---|---|---|
| SSL1 Vt | 1V | 2V | 3V | 4V |
| SSL2 Vt | 4V | 3V | 2V | 1V |

| Layer # | 1 | 2 | 3 | 4 | 5 | 6 | 7 | 8 |
|---|---|---|---|---|---|---|---|---|
| SSL1 Vth | 1V | 2V | 3V | 4V | 5V | 6V | 7V | 8V |
| SSL2 Vth | 8V | 7V | 6V | 5V | 4V | 3V | 2V | 1V |

| Layer # | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| SSL1 Vth | 1V | 2V | 3V | 4V | 1V | 2V | 3V | 4V | 1V | 2V | 3V | 4V | 1V | 2V | 3V | 4V |
| SSL2 Vth | 4V | 3V | 2V | 1V | 4V | 3V | 2V | 1V | 4V | 3V | 2V | 1V | 4V | 3V | 2V | 1V |
| SSL3 Vth | 1V | 1V | 1V | 1V | 2V | 2V | 2V | 2V | 3V | 3V | 3V | 3V | 4V | 4V | 4V | 4V |
| SSL4 Vth | 4V | 4V | 4V | 4V | 3V | 3V | 3V | 3V | 2V | 2V | 2V | 2V | 1V | 1V | 1V | 1V |

Fig. 10

| Layer # | 1 | 2 | 3 | 4 |
|---|---|---|---|---|
| SSL1 Vth | 0.5V < Vth < 1.2V | 1.2V < Vth < 2.2V | 2.2V < Vth < 3V | Vth > 3V |
| SSL2 Vth | Vth > 4V | 3.2V < Vth < 4V | 2.5V < Vth < 3.2V | 1.5V < Vth < 2.5V |

Fig. 15

Z-DIRECTION DECODING FOR THREE DIMENSIONAL MEMORY ARRAY

BACKGROUND

1. Field of the Invention

This technology relates to high density memory devices with decoding structures in the z-direction, or depth direction. Such decoding distinguishes between different levels, or layers, of memory cells arranged to provide a three-dimensional memory array.

2. Description of Related Art

In Patent Application Publication 2010/0226195, a three dimensional memory array has the decoding function for the z-direction, or depth direction, removed from the actual array. In one example, a word line-like structure electrically connects the gates of only transistors that are in a same level of the three dimensional memory array, and are electrically disconnected from the gates transistors that are in a different level of the three dimensional memory array. In another example, the ends of NAND strings on a same level of the three dimensional memory array are electrically connected together, and are electrically disconnected from the ends of NAND strings on that are in a different level of the three dimensional memory array. Neither of these examples performs decoding of the level at the three dimensional memory array. Instead, actual decoding is performed in remotely located circuitry that then determines which level of NAND strings is selected for a particular operation. Complexity results from the structures and interconnects which connect the decoded level signals to the different levels of the three dimensional memory array.

SUMMARY

One aspect of the technology is an integrated circuit, which includes a three dimensional memory array, a plurality of select lines, and control circuitry.

The three dimensional memory array includes a plurality of levels. The levels include respective two dimensional arrays of NAND strings. The NAND strings include memory cells and switch transistors. The switch transistors have combinations of threshold voltage levels that vary across the plurality of levels. In one example, there are two threshold voltage levels, each defined by an acceptable range of threshold voltages. Other examples have more than two threshold voltage levels.

The plurality of select lines are electrically coupled to the switch transistors. For example, a select line is orthogonally arranged across the NAND strings to control the gate voltage of switch transistors in the NAND strings.

The control circuitry applies a bias arrangement to the plurality of select lines. Due to the bias arrangement, the NAND strings on a particular level of the plurality of levels are selected by the switch transistors, and the NAND strings on other levels of the plurality of levels are deselected by the switch transistors. The NAND strings on a particular level are selected, when the switch transistors are turned on for the switch transistors in the NAND strings on the particular level. The NAND strings on other levels are deselected, when at least one of the switch transistors is turned off for the switch transistors in the NAND strings on the particular level. Because the NAND strings are series connected, a minimum of one series transistor being turned off is sufficient to deselect the NAND string.

In some embodiments, threshold voltages of the switch transistors controlled by one of the plurality of select lines are from a quantity of switch threshold voltage levels, and the quantity of threshold voltage levels is equal to a number of levels in the plurality of levels of the three dimensional array. Some examples of the quantity of switch threshold voltage levels and the number of levels in the plurality of levels of the three dimensional array, are 4 levels, 8 levels, 16 levels, other multiples of 2, and other numbers of levels.

In some embodiments, the plurality of select lines includes two select lines, and the switch transistors electrically coupled to the two select lines distinguish the NAND strings on the particular level from the NAND strings on the other levels of the plurality of levels. In this example, the two select lines control two switch transistors in a NAND string. The NAND strings on a particular level are deselected if one or both switch transistors are off. The NAND strings on a particular level are selected if both switch transistors are on.

In some embodiments, threshold voltages of the switch transistors controlled by one of the plurality of select lines are from a quantity of switch threshold voltage levels, and the quantity of threshold voltage levels is equal to a square root of a number of levels in the plurality of levels of the three dimensional array. Some examples of the quantity of switch threshold voltage levels and the number of levels in the plurality of levels of the three dimensional array, are 4 switch threshold voltage levels and 16 levels in the three dimensional array, 8 switch threshold voltage levels and 64 levels in the three dimensional array, and other numbers of levels.

In some embodiments, the plurality of select lines includes four select lines, and the switch transistors electrically coupled to the four select lines distinguish NAND strings on the particular level from the NAND strings on the other levels of the plurality of levels. In this example, the four select lines control four switch transistors in a NAND string. The NAND strings on a particular level are deselected if one, two, three, or four switch transistors are off. The NAND strings on a particular level are selected if the four switch transistors are on.

In some embodiments, threshold voltages of the switch transistors coupled to different select lines of the plurality of select lines are from corresponding sets of switch threshold voltage levels, which may be different or the same. For example, a first set of switch transistors controlled by a first select line has threshold voltages from a first set of switch threshold voltage levels, and a second set of switch transistors controlled by a second select line has threshold voltages from a second set of switch threshold voltage levels. In one example, the first set of switch threshold voltage levels includes 0.5V<Vth<1.2V, 1.2V<Vth<2.2V, 2.2V<Vth<3V, and Vth>3V; and the second set of switch threshold voltages includes Vth>4V, 3.2V<Vth<4V, 2.5V<Vth<3.2V, and 1.5V<Vth<2.5V. The sets of threshold voltages are different not because of different ordering (increasing versus decreasing), but because the threshold voltage ranges are different, for example Vth>3V versus Vth>4V. In this example, the quantity of threshold voltage levels is the same for the first and second sets of switch threshold voltage levels.

In some embodiments, the plurality of select lines includes a first select line and a second select line. The switch transistors include a first set of switch transistors electrically coupled to the first select line, and a second set of switch transistors electrically coupled to the second select line. The NAND strings include memory cells in series with a first switch transistor from the first set of switch transistors, and a second switch transistor from the second set of switch transistors. Threshold voltages of the first set of switch transistors are from a first set of switch threshold voltage levels having a quantity of switch threshold voltage levels, and threshold voltages of the second set of switch transistors are from a second set of switch threshold voltage levels having the same quantity of switch threshold voltage levels. The number of levels in the plurality of levels of the three dimensional array is equal to the same quantity of switch threshold voltage levels. The first and second sets of switch threshold voltage levels may be the same or different.

In some embodiments, the plurality of select lines includes a first select line, a second select line, a third select line, and a fourth select line. The switch transistors include a first set of switch transistors electrically coupled to the first select line, a second set of switch transistors electrically coupled to the second select line, a third set of switch transistors electrically coupled to the third select line, and a fourth set of switch transistors electrically coupled to the fourth select line. The NAND strings include memory cells in series with a first switch transistor from the first set of switch transistors, a second switch transistor from the second set of switch transistors, a third switch transistor from the third set of switch transistors, and a fourth switch transistor from the fourth set of switch transistors. Threshold voltages of the first set of switch transistors are from a first set of switch threshold voltage levels having a first quantity of switch threshold voltage levels. Threshold voltages of the second set of switch transistors are from a second set of switch threshold voltage levels having the same first quantity of switch threshold voltage levels. Threshold voltages of the third set of switch transistors are from a third set of switch threshold voltage levels having a second quantity of switch threshold voltage levels. Threshold voltages of the fourth set of switch transistors are from a fourth set of switch threshold voltage levels having the same second quantity of switch threshold voltage levels. The number of levels in the plurality of levels of the three dimensional array is equal to a product of the first quantity of switch threshold voltage levels and the second quantity of threshold voltage levels.

In some embodiments, the plurality of select lines includes a first select line and a second select line. The switch transistors include a first set of switch transistors electrically coupled to the first select line, and a second set of switch transistors electrically coupled to the second select line. The NAND strings include memory cells in series with a first switch transistor from the first set of switch transistors and a second switch transistor from the second set of switch transistors. Threshold voltages of the first set of switch transistors are paired with threshold voltages of the second set of switch transistors. A first threshold voltage of the first switch transistors on the particular level at an i-th threshold voltage level in a first set of N ordered threshold voltage levels, is paired with a second threshold voltage of the second switch transistors on the particular level at an i-th threshold voltage level in a second set of N decreasingly ordered threshold voltage levels.

For example, if the set of N=4 ordered threshold voltages includes (1V, 2V, 3V, 4V) then an increasing set of threshold voltages is (1V, 2V, 3V, 4V), and a decreasing set of threshold voltages is (4V, 3V, 2V, 1V). Examples of paired threshold voltages of first and second switch transistors are 1V and 4V; 2V and 3V; 3V and 2V; and 4V and 1V. The voltage values are examples only, and can be other integer values and noninteger values.

In another example, if the set of N=8 ordered threshold voltages includes (1V, 2V, 3V, 4V, 5V, 6V, 7V, 8V) then an increasing set of threshold voltages is (1V, 2V, 3V, 4V, 5V, 6V, 7V, 8V), and a decreasing set of threshold voltages is (8V, 7V, 6V, 5V, 4V, 3V, 2V, 1V). Examples of paired threshold voltages of first and second switch transistors are 1V and 8V; 2V and 7V; 3V and 6V; and 4V and 5V; 5V and 4V; 6V and 3V; 7V and 2V; and 8V and 1V.

The voltage values are examples only, and can be other integer values and noninteger values. Also, threshold voltages do not have to be symmetrical between the increasing and decreasing sets of threshold voltages. The increasing set of threshold voltages can have one or more values absent from the decreasing set of threshold voltages. The decreasing set of threshold voltages can have one or more values absent from the increasing set of threshold voltages.

In some embodiments, the plurality of select lines includes a first select line, a second select line, a third select line, and a fourth select line. The switch transistors includes a first set of switch transistors electrically coupled to the first select line, a second set of switch transistors electrically coupled to the second select line, a third set of switch transistors electrically coupled to the third select line, and a fourth set of switch transistors electrically coupled to the fourth select line. The NAND strings include memory cells in series with a first switch transistor from the first set of switch transistors, a second switch transistor from the second set of switch transistors, a third switch transistor from the third set of switch transistors, and a fourth switch transistor from the fourth set of switch transistors. Threshold voltages of the first set of switch transistors, the second set of switch transistors, the third set of switch transistors, and the fourth set of switch transistors are from corresponding sets of switch threshold voltage levels having N switch threshold voltage levels. Threshold voltages of the first set of switch transistors are paired with threshold voltages of the second set of switch transistors, such that the bias arrangement applied to the first select line and the second select line selects the NAND strings on a fraction (1/N) of the plurality of levels. Threshold voltages of the third set of switch transistors are paired with threshold voltages of the fourth set of switch transistors, such that the bias arrangement applied to the third select line and the fourth select line selects the NAND strings on the fraction (1/N) of the plurality of levels. The intersection of the NAND strings selected by the first select line and the second select line, and the NAND strings selected by the third select line and the fourth select line, selects the NAND strings on the particular level of the plurality of levels.

The intersection of the fraction (1/N) of the plurality of levels selected by the first select line and the second select line, and the fraction (1/N) of the plurality of levels selected by the third select line and the fourth select line, selects the fraction (1/N$^2$) of the plurality of levels. For example, when N=4 threshold voltage levels, the fraction (¼) of the levels are selected by the first select line and the second select line, the fraction (¼) of the levels are selected by the third select line and the fourth select line, and the intersection selects (1/16) of the levels, such that from 16 levels of an array, one level is selected.

Another aspect of the technology is a method comprising: selecting NAND strings including memory cells and switch transistors on a particular level of a plurality of levels of a three dimensional memory array, and deselecting NAND strings on other levels of the plurality of levels, by applying a bias arrangement to a plurality of select lines electrically coupled to the switch transistors having combinations of threshold voltages that vary across the plurality of levels.

Various embodiments and aspect are disclosed herein.

BRIEF DESCRIPTION OF THE DRAWINGS

FIG. 10 is a table showing an example of threshold voltage combinations of the quartets of switch transistors in NAND strings on different layers of the 16-layer 3D NAND memory structure corresponding to the circuit of FIG. 11.

FIG. 15 is a table showing an example of threshold voltage combinations of the pairs of switch transistors in NAND strings on different layers of the 4-layer 3D NAND memory structure, corresponding to the circuit of FIG. 14.

DETAILED DESCRIPTION

Figure 1:
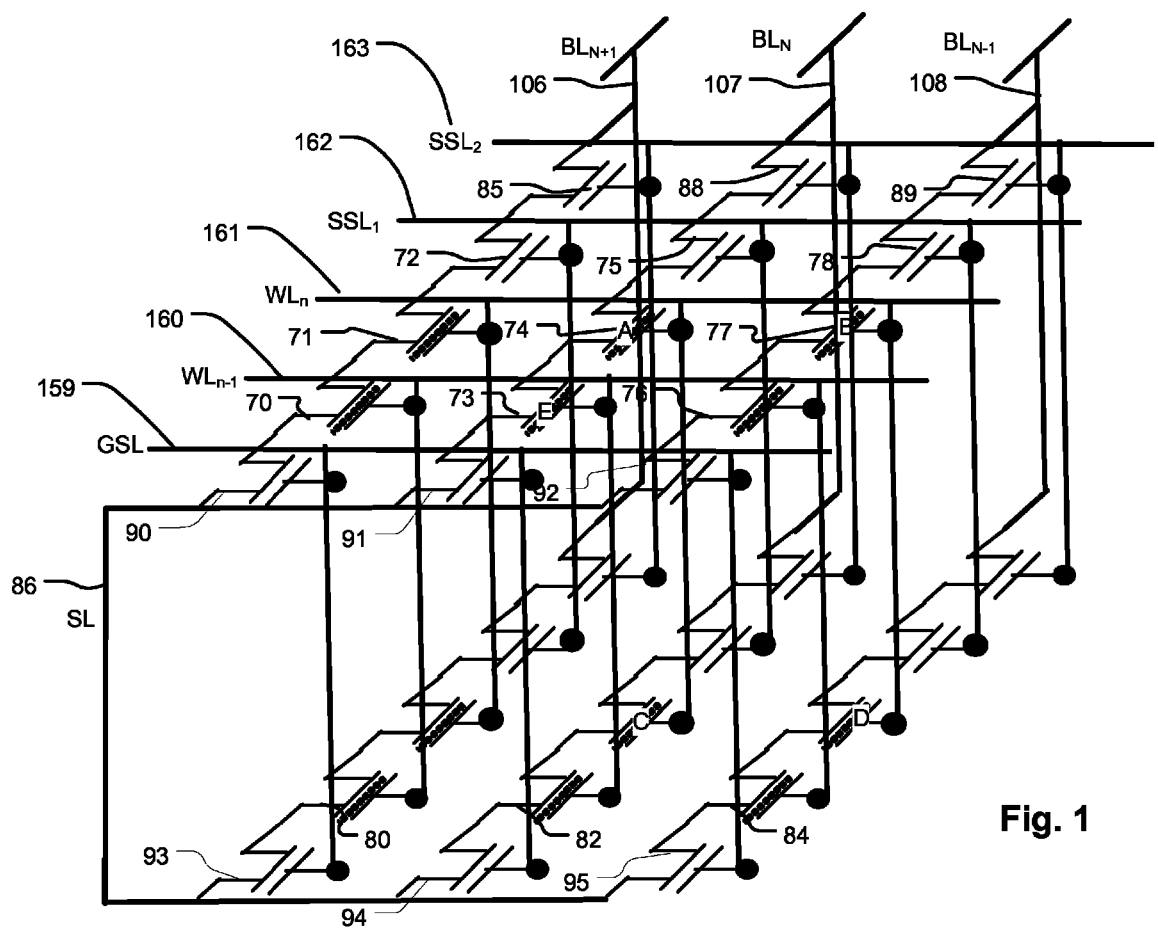
FIG. 1 is a perspective illustration of a 3D NAND memory structure with multiple layers of NAND strings, and switch transistors in the NAND strings that select the NAND strings in a particular layer of the 4-layer 3D NAND memory structure.

FIG. 1 is a schematic diagram showing 2 levels of memory cells, each having memory cells arranged in a NAND configuration of several NAND strings. This configuration is representative of a cube which can include many levels and many word lines. The shown cube includes 3 stacks of memory cells, with each stack of memory cells including NAND strings stacked 2 levels high and 1 string wide.

The 2 levels of memory cells are defined at the cross-points of conductive lines 160 and 161 acting as word line WLn−1 and word line WLn, with a first stack of conductive strips, a second stack of conductive strips and a third stack of conductive strips. The 2 levels of switch transistors are defined at the cross-points of conductive lines 162 and 163 acting as string select line SSL1 and string select line SSL2, with a first stack of conductive strips, a second stack of conductive strips and a third stack of conductive strips. Other embodiments have a different number of string select lines, such as four string select lines.

The first level corresponds with an upper level in the cube and includes memory cells 70, 71 and switch transistors 72, 85 in a NAND string on a conductive strip; memory cells 73, 74 and switch transistors 75, 88 in a NAND string on a conductive strip; and memory cells 76, 77 and switch transistors 78, 89 in a NAND string on a conductive strip.

The second level corresponds with a bottom level in the cube in this example, and includes memory cells (e.g. 80, 82, 84) and switch transistors arranged in NAND strings in a similar manner those in the first level.

As shown in the figure, the conductive line 161 acting as word line WLn includes vertical extensions in order to couple the conductive line 161 to the memory cells (cells 71, 74, 77 in the first level) in the interface regions in the trenches between the conductive strips in all of the levels. The other conductive lines 159, 160, 162, 163 include similar vertical extensions.

String select transistor pairs 72, 85; 75, 88; and 78, 89 are connected between respective NAND strings and bit line $BL_{N+1}$, bit line $BL_N$, bit line $BL_{N-1}$ in this arrangement. Likewise, similar string select transistors on a bottom level in the cube are connected between respective NAND strings and bit line $BL_{N+1}$ 106, bit line $BL_N$ 107, bit line $BL_{N-1}$ 108 in this arrangement. Bit line $BL_{N+1}$ 106, bit line $BL_N$ 107, bit line $BL_{N-1}$ 108 are connected respectively to ends of the NAND strings in the stack of conductive strips to the left, center, and right in the figure.

Block select transistors 90-95 are arranged at the opposite ends of the NAND strings and are used to couple the NAND strings in a selected cube to a reference source such as ground. The ground select line GSL 159 in this example is coupled to the gates of the block select transistors 90-95, and can be implemented in the same manner as the conductive lines 160, 161 and 162. The string select transistors and block select transistors can use the same dielectric stack as a gate oxide as the memory cells in some embodiments. In other embodiments, a typical gate oxide is used instead. Also, the channel lengths and widths can be adjusted as suits the designer to provide the switching function for the transistors.

Examples of setting the voltages of the switch transistors are programming the switch transistors, and manufacturing the switch transistors such as with appropriate implant doses.

Figures 2, 3:
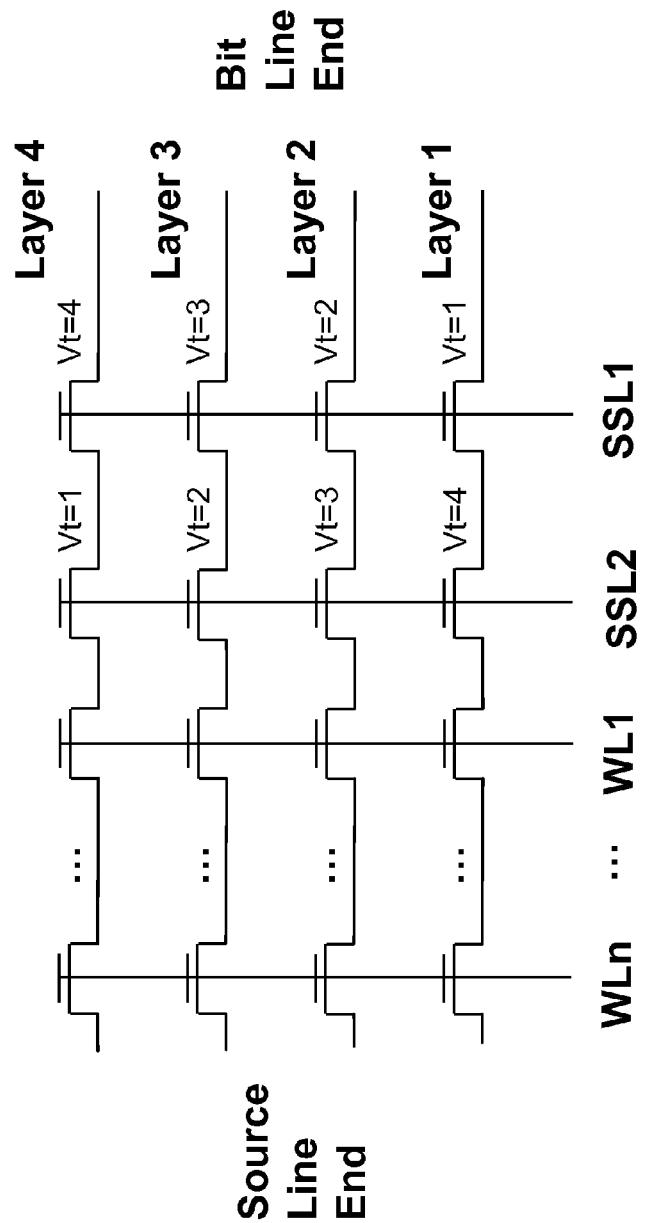
FIG. 2 is a table showing an example of threshold voltage combinations of the pairs of switch transistors in NAND strings on different layers of the 4-layer 3D NAND memory structure corresponding to the circuit of FIG. 3.
FIG. 3 is a circuit schematic showing the threshold voltages of the pairs of switch transistors in the NAND strings on different layers of the 4-layer 3D NAND memory structure, corresponding to the table of FIG. 2.

FIG. 2 is a table showing an example of threshold voltage combinations of the pairs of switch transistors in NAND strings on different layers of the 4-layer 3D NAND memory structure.

FIG. 3 is a circuit schematic showing the threshold voltages of the pairs of switch transistors in the NAND strings on different layers of the 4-layer 3D NAND memory structure, corresponding to the table of FIG. 2.

The NAND strings on the various layers of the 4-layer 3D NAND memory structure have 2 series-coupled switch transistors.

The specific threshold voltages are examples. The pair of switch transistors—controlled by 2 different string select lines—have threshold voltages that are paired, such that a bias arrangement applied to the 2 different string select lines selects the layer of NAND strings having the appropriate pair of threshold voltages. More generally, switch transistor threshold voltages are from the set of threshold voltages (Vth1, Vth2, Vth3, Vth4) such that Vth1<Vth2<Vth3<Vth4.

The different layers of the NAND memory structure have pairs of switch transistors with a corresponding pair of threshold voltages (Vth of switch transistor controlled by SSL1, Vth of switch transistor controlled by SSL2) as follows. In a first layer of the NAND memory structure, the pair of switch transistors in the NAND strings have the threshold voltage pair (Vth1, Vth4). In a second layer of the NAND memory structure, the pair of switch transistors in the NAND strings have the threshold voltage pair (Vth2, Vth3). In a third layer of the NAND memory structure, the pair of switch transistors in the NAND strings have the threshold voltage pair (Vth3, Vth2). In a fourth layer of the NAND memory structure, the pair of switch transistors in the NAND strings have the threshold voltage pair (Vth4, Vth1).

The physical order of the just described layers within the 3D NAND memory structure may be consecutive, from the top layer to the bottom layer, or from the bottom layer to the top layer. The order of the just described layers within the 3D NAND memory structure also may be nonconsecutive.

FIGS. 4-7 are circuit schematics showing how various bias arrangements applied to the two select lines select different layers of NAND strings in the 3D NAND memory structure, where the bias arrangements applied to the two select lines control the two switch transistors in the NAND strings, corresponding to the table of FIG. 2 and the circuit schematic of FIG. 3.

Figure 4:
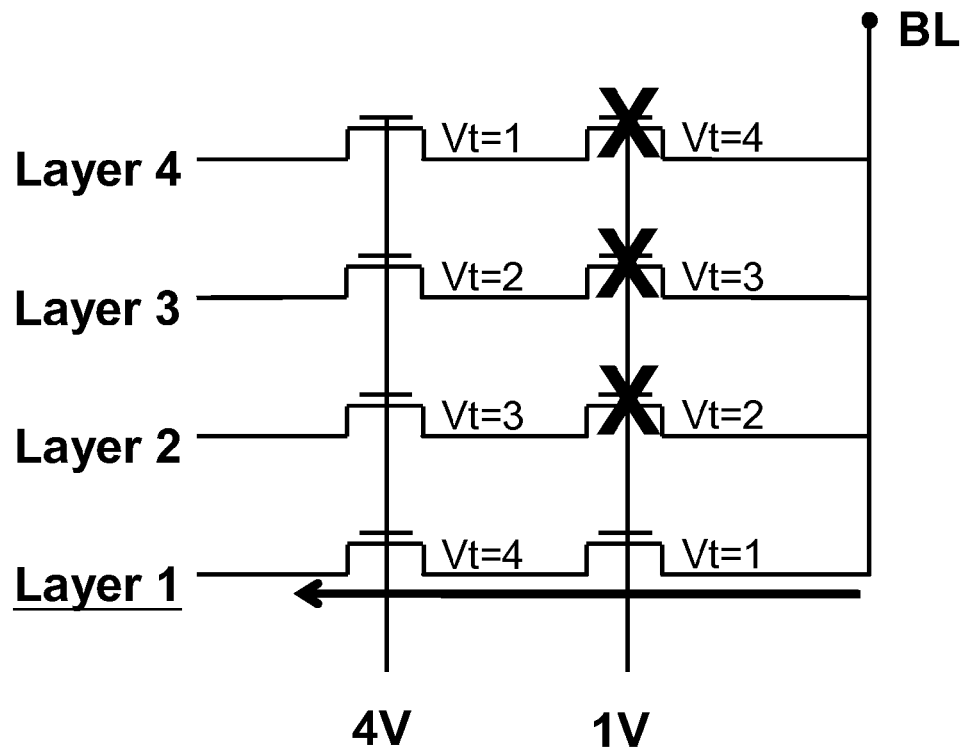
FIGS. 4-7 are circuit schematics showing how various bias arrangements applied to the two select lines select different layers of NAND strings in the 3D NAND memory structure, where the bias arrangements applied to the two select lines control the two switch transistors in the NAND strings, corresponding to the table of FIG. 2 and the circuit schematic of FIG. 3.

In FIG. 4, the bias arrangement applied to the strings select lines (voltage applied to SSL1, voltage applied to SSL2) is (1V, 4V). The 1V bias applied to SSL1 turns on the switch transistors of layer 1. The 4V bias applied to SSL2 turns on the switch transistors of all layers. The intersection of these layers is only layer 1, thereby decoding layer 1.

Figure 5:
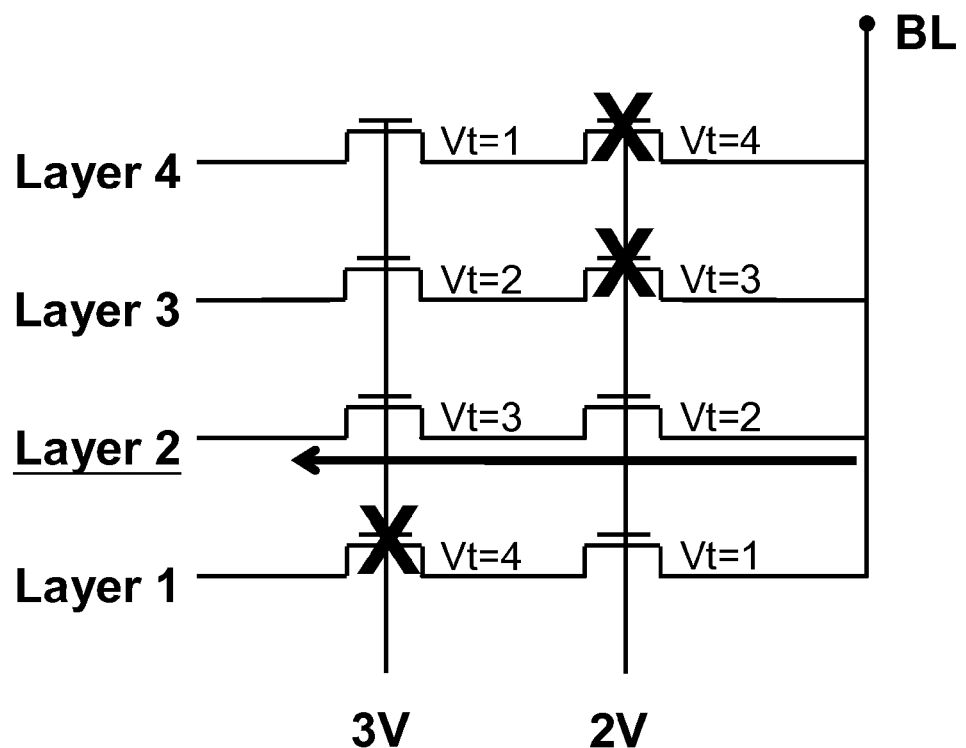

In FIG. 5, the bias arrangement applied to the strings select lines (voltage applied to SSL1, voltage applied to SSL2) is (2V, 3V). The 2V bias applied to SSL1 turns on the switch transistors of layers 1 and 2. The 3V bias applied to SSL2 turns on the switch transistors of layers 2, 3, and 4. The intersection of these layers is only layer 2, thereby decoding layer 2.

Figure 6:
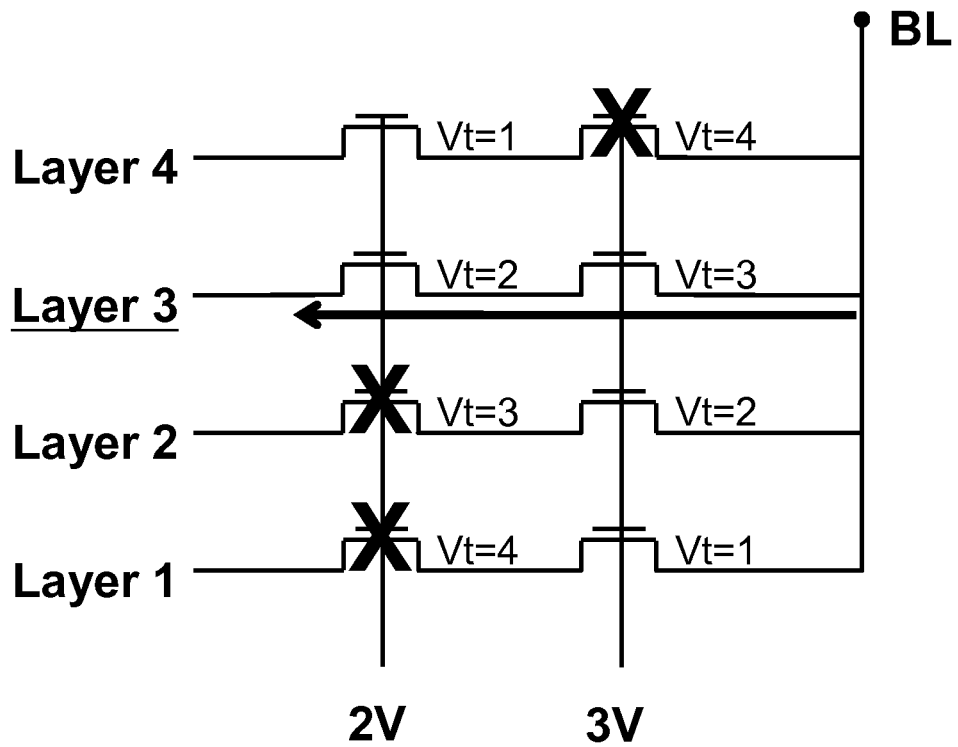

In FIG. 6, the bias arrangement applied to the strings select lines (voltage applied to SSL1, voltage applied to SSL2) is (3V, 2V). The 3V bias applied to SSL1 turns on the switch transistors of layers 1, 2, and 3. The 2V bias applied to SSL2 turns on the switch transistors of layers 3 and 4. The intersection of these layers is only layer 3, thereby decoding layer 3.

Figure 7:
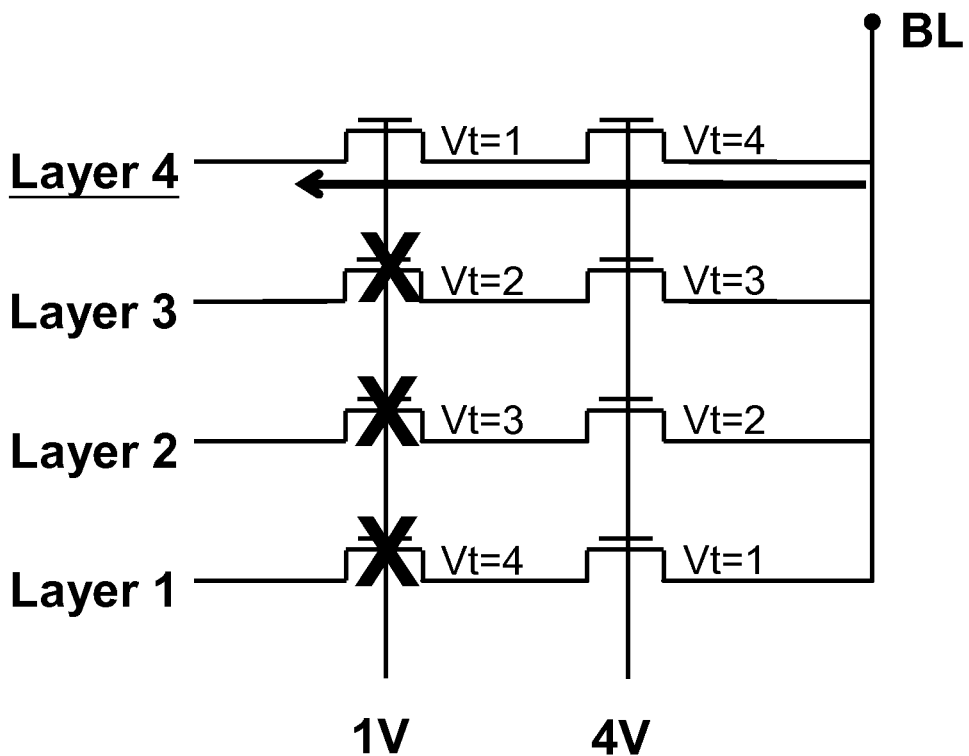

In FIG. 7, the bias arrangement applied to the strings select lines (voltage applied to SSL1, voltage applied to SSL2) is (4V, 1V). The 4V bias applied to SSL1 turns on the switch transistors of all layers. The 1V bias applied to SSL2 turns on the switch transistors of layer 4. The intersection of these layers is only layer 4, thereby decoding layer 4.

Figures 8, 9:
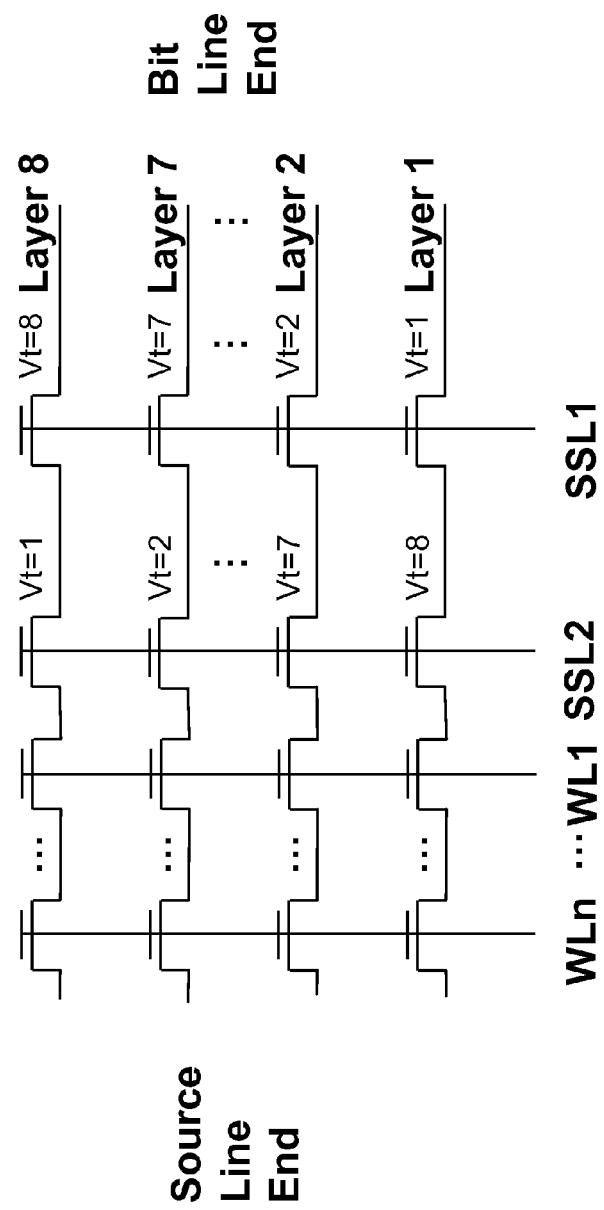
FIG. 8 is a table showing an example of threshold voltage combinations of the pairs of switch transistors in NAND strings on different layers of the 8-layer 3D NAND memory structure corresponding to the circuit of FIG. 9.
FIG. 9 is a circuit schematic showing the threshold voltages of the pairs of switch transistors in the NAND strings on different layers of the 8-layer 3D NAND memory structure, corresponding to the table of FIG. 8.

FIG. 8 is a table showing an example of threshold voltage combinations of the pairs of switch transistors in NAND strings on different layers of the 8-layer 3D NAND memory structure.

FIG. 9 is a circuit schematic showing the threshold voltages of the pairs of switch transistors in the NAND strings on different layers of the 8-layer 3D NAND memory structure, corresponding to the table of FIG. 8

The NAND strings on the various layers of the 8-layer 3D NAND memory structure have 2 series-coupled switch transistors.

The specific threshold voltages are examples. The pair of switch transistors—controlled by 2 different string select lines—have threshold voltages that are paired, such that a bias arrangement applied to the 2 different string select lines selects the layer of NAND strings having the appropriate pair of threshold voltages. More generally, switch transistor threshold voltages are from the set of threshold voltages (Vth1, Vth2, Vth3, Vth4, Vth5, Vth6, Vth7, Vth8) such that Vth1<Vth2<Vth3<Vth4<Vth5<Vth6<Vth7<Vth8.

The different layers of the NAND memory structure have pairs of switch transistors with a corresponding pair of threshold voltages (Vth of switch transistor controlled by SSL1, Vth of switch transistor controlled by SSL2) as follows. In a first layer of the NAND memory structure, the pair of switch transistors in the NAND strings have the threshold voltage pair (Vth1, Vth8). In a second layer of the NAND memory structure, the pair of switch transistors in the NAND strings have the threshold voltage pair (Vth2, Vth7). In a third layer of the NAND memory structure, the pair of switch transistors in the NAND strings have the threshold voltage pair (Vth3, Vth6). In a fourth layer of the NAND memory structure, the pair of switch transistors in the NAND strings have the threshold voltage pair (Vth4, Vth5). In a fifth layer of the NAND memory structure, the pair of switch transistors in the NAND strings have the threshold voltage pair (Vth5, Vth4). In a sixth layer of the NAND memory structure, the pair of switch transistors in the NAND strings have the threshold voltage pair (Vth6, Vth3). In a seventh layer of the NAND memory structure, the pair of switch transistors in the NAND strings have the threshold voltage pair (Vth7, Vth2). In a eighth layer of the NAND memory structure, the pair of switch transistors in the NAND strings have the threshold voltage pair (Vth8, Vth1).

The physical order of the just described layers within the 3D NAND memory structure may be consecutive, from the top layer to the bottom layer, or from the bottom layer to the top layer. The order of the just described layers within the 3D NAND memory structure also may be nonconsecutive.

FIG. 10 is a table showing an example of threshold voltage combinations of the quartets of switch transistors in NAND strings on different layers of the 16-layer 3D NAND memory structure.

Figure 11:
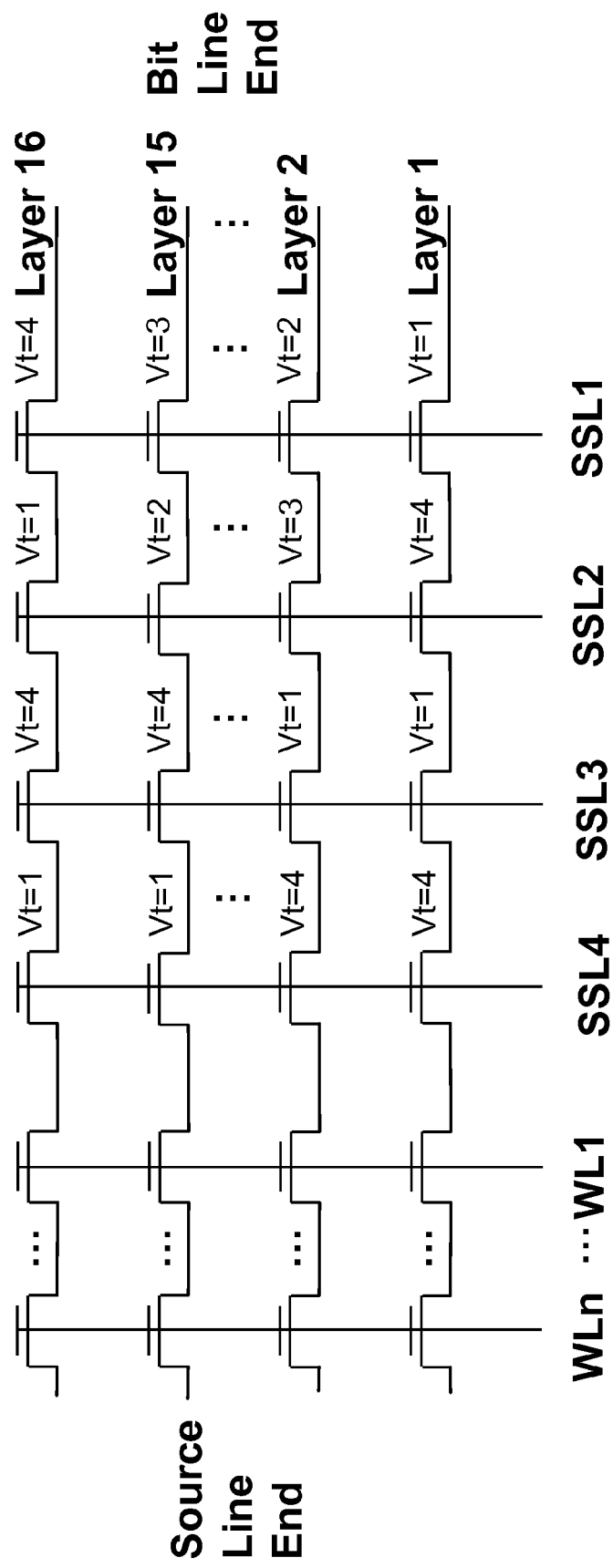
FIG. 11 is a circuit schematic showing the threshold voltages of the quartets of switch transistors in the NAND strings on different layers of the 16-layer 3D NAND memory structure, corresponding to the table of FIG. 10.

FIG. 11 is a circuit schematic showing the threshold voltages of the quartets of switch transistors in the NAND strings on different layers of the 16-layer 3D NAND memory structure, corresponding to the table of FIG. 10.

The NAND strings on the various layers of the 16-layer 3D NAND memory structure have 4 series-coupled switch transistors.

The specific threshold voltages are examples. The quartet of switch transistors—controlled by 4 different string select lines—have threshold voltages that are quartets.

More generally, switch transistor threshold voltages are from the set of threshold voltages (Vth1, Vth2, Vth3, Vth4) such that Vth1<Vth2<Vth3<Vth4.

The quartet of switch transistors controlled by 4 different string select lines is divided into a first pair of switch transistors controlled by a first pair of string select lines, and a second pair of switch transistors controlled by a second pair of string select lines. The two pairs of switch transistors and string select transistors are discussed separately because of the different assignment of threshold voltages for each pair of switch transistors and string select transistors.

The first pair of switch transistors is controlled by a first pair of string select lines SSL1 and SSL2, and the second pair of switch transistors is controlled by a second pair of string select lines SSL3 and SSL4.

The different layers of the NAND memory structure have first pairs of switch transistors with a corresponding first pair of threshold voltages (Vth of switch transistor controlled by SSL1, Vth of switch transistor controlled by SSL2) as follows. In a first, fifth, ninth, and thirteenth layer of the NAND memory structure, the pair of switch transistors in the NAND strings have the threshold voltage pair (Vth1, Vth4). In a second, sixth, tenth, and fourteenth layer of the NAND memory structure, the pair of switch transistors in the NAND strings have the threshold voltage pair (Vth2, Vth3). In a third, seventh, eleventh, and fifteenth layer of the NAND memory structure, the pair of switch transistors in the NAND strings have the threshold voltage pair (Vth3, Vth2). In a fourth, eighth, twelfth, and sixteenth layer of the NAND memory structure, the pair of switch transistors in the NAND strings have the threshold voltage pair (Vth4, Vth1).

The physical assignment of the just described layers within the 3D NAND memory structure may be different according to different mathematical permutations, so long as a bias arrangement applied to the string select lines SSL1 and SSL2 selects (¼) of the layers.

The different layers of the NAND memory structure have second pairs of switch transistors with a corresponding second pair of threshold voltages (Vth of switch transistor controlled by SSL3, Vth of switch transistor controlled by SSL4) as follows. In a first, second, third, and fourth layer of the NAND memory structure, the pair of switch transistors in the NAND strings have the threshold voltage pair (Vth1, Vth4). In a fifth, sixth, seventh, and eighth layer of the NAND memory structure, the pair of switch transistors in the NAND strings have the threshold voltage pair (Vth2, Vth3). In a ninth, tenth, eleventh, and twelfth layer of the NAND memory structure, the pair of switch transistors in the NAND strings have the threshold voltage pair (Vth3, Vth2). In a thirteenth, fourteenth, fifteenth, and sixteenth layer of the NAND memory structure, the pair of switch transistors in the NAND strings have the threshold voltage pair (Vth4, Vth1).

The physical assignment of the just described layers within the 3D NAND memory structure may be different according to different mathematical permutations, so long as a bias arrangement applied to the string select lines SSL3 and SSL4 selects (¼) of the layers.

An intersection of the NAND strings selected by the first select line SSL1 and the second select line SSL2 ((¼)*16 layers=4 layers), and the NAND strings selected by the third select line SSL3 and the fourth select line SSL4 ((¼)*16 layers=4 layers), selects the NAND strings on the particular level of the plurality of levels ((¼)*(¼)*16 layers=1 layer).

In other embodiments, the first pair of select lines is not necessarily SSL1 and SSL2 but another permutation of string select lines (e.g., SSL3 and SSL4, SSL1 and SSL3, SSL2 and SSL1), and the second pair of select lines is not necessarily SSL3 and SSL4 but another permutation of string select lines (e.g., SSL1 and SSL2, SSL2 and SSL4, SSL4 and SSL3).

Figures 12, 13, 14:
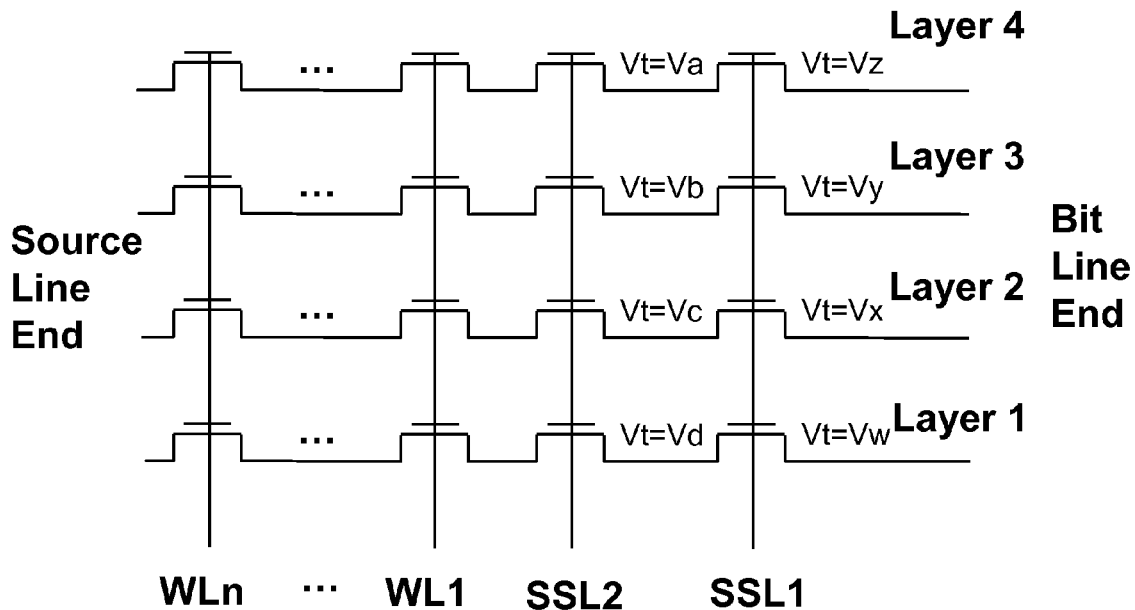
FIGS. 12-13 are tables showing examples of threshold voltage combinations of the pairs of switch transistors in NAND strings on different layers of the 4-layer 3D NAND memory structure, corresponding to the circuit of FIG. 14.
FIG. 14 is a circuit schematic showing the threshold voltages of the pairs of switch transistors in the NAND strings on different layers of the 4-layer 3D NAND memory structure, corresponding to the tables of FIGS. 12, 13, and 15.

FIGS. 12-13 and 15 are tables showing examples of threshold voltage combinations of the pairs of switch transistors in NAND strings on different layers of the 4-layer 3D NAND memory structure, corresponding to the circuit of FIG. 14. FIGS. 12-13 and 15 are more general than FIG. 2. FIGS. 12-13 and 15 do not require symmetry between the increasing threshold voltage for the switch transistors of one select line and the decreasing threshold voltages of another select line.

FIG. 12 shows that the threshold voltages of the switch transistors increase with layer number for the switch transistors controlled by SSL1. FIG. 12 also shows that the threshold voltages of the switch transistors decrease with layer number for the switch transistors controlled by SSL2.

FIG. 13 shows that the threshold voltages of the switch transistors decrease with layer number for the switch transistors controlled by SSL1. FIG. 13 also shows that the threshold voltages of the switch transistors increase with layer number for the switch transistors controlled by SSL2.

For FIGS. 12 and 13, it is not necessary to have symmetrical threshold voltages Vt between the switch transistors controlled by SSL1 and SSL2. For example, it is not required that Va=Vw, Vx=Vb, Vy=Vc, or Vz=Vd.

FIG. 15 shows a specific example of threshold voltage levels that are not symmetrical between the increasing threshold voltage for the switch transistors of one select line and the decreasing threshold voltages of another select line. The first set of switch threshold voltage levels includes 0.5V<Vth<1.2V, 1.2V<Vth<2.2V, 2.2V<Vth<3V, and Vth>3V; and the second set of switch threshold voltages includes Vth>4V, 3.2V<Vth<4V, 2.5V<Vth<3.2V, and 1.5V<Vth<2.5V.

FIG. 14 is a circuit schematic showing the threshold voltages of the pairs of switch transistors in the NAND strings on different layers of the 4-layer 3D NAND memory structure, corresponding to the tables of FIGS. 12, 13, and 15. FIG. 14 is more general than FIG. 3. FIG. 14 does not require symmetry between the increasing threshold voltage for the switch transistors of one select line and the decreasing threshold voltages of another select line.

In other embodiments, symmetry is not required between the increasing threshold voltage for the switch transistors of one select line and the decreasing threshold voltages of another select line, for the examples shown in FIGS. 8-11.

Figure 16:
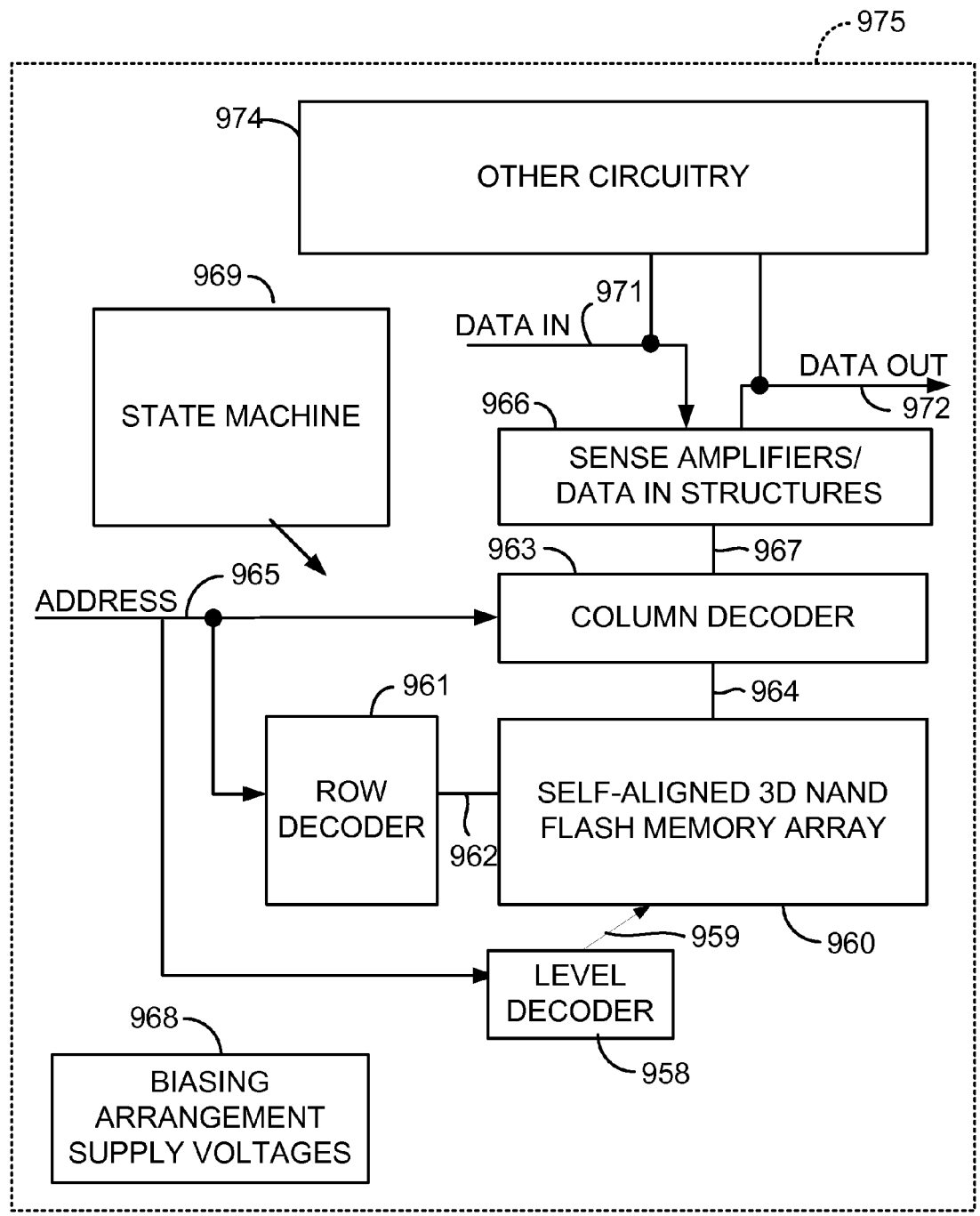
FIG. 16 is a simplified block diagram of an integrated circuit according to an embodiment of the present technology.

FIG. 16 is a simplified block diagram of an integrated circuit according to an embodiment of the present technology. The integrated circuit line 975 includes a 3D NAND flash memory array 960, implemented as described herein, on a semiconductor substrate. A row decoder 961 is coupled to a plurality of word lines 962, and arranged along rows in the memory array 960. A column decoder 963 is coupled to a plurality of bit lines 964 arranged along columns in the memory array 960 for reading and programming data from the memory cells in the array 960. A level decoder 958 is coupled to a plurality of levels in the memory array 960 via SSL lines 959. Level decoding is performed by applying bias arrangements to the SSL lines as described above. Addresses are supplied on bus 965 to column decoder 963, row decoder 961 and plane decoder 958. Sense amplifiers and data-in structures in block 966 are coupled to the column decoder 963 in this example via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Although the shown string select lines controlling switch transistors are shown adjacent to each other, the string select lines can be nonadjacent, such as having one or more select lines on one side of the word lines, and one or more other select lines on the other side of the word lines.

In various embodiments, the memory cells accessed by word lines are nonvolatile memory cells such as charge trapping memory cells or flash memory cells, or volatile memory cells. In various embodiments the switch transistors accessed by select lines are nonvolatile memory cells such as charge trapping memory cells or flash memory cells, or volatile memory cells.

It is contemplated that modifications and combinations will readily occur to those skilled in the art, which modifications and combinations will be within the spirit of the invention and the scope of the following claims.

The invention claimed is:

1. An integrated circuit comprising:
a three dimensional memory array including a plurality of levels, levels in the plurality of levels including respective two dimensional arrays of NAND strings, the NAND strings including memory cells and switch transistors, the switch transistors having combinations of threshold voltage levels that vary across the plurality of levels;
a plurality of select lines electrically coupled to the switch transistors; and
control circuitry applying a bias arrangement to the plurality of select lines such that the NAND strings on a particular level of the plurality of levels are selected by the switch transistors, and the NAND strings on other levels of the plurality of levels are deselected by the switch transistors.

2. The integrated circuit of claim 1, wherein threshold voltages of the switch transistors controlled by one of the plurality of select lines are from a quantity of switch threshold voltage levels, and the quantity of threshold voltage levels is equal to a number of levels in the plurality of levels of the three dimensional array.

3. The integrated circuit of claim 1, wherein the plurality of select lines includes two select lines, and the switch transistors electrically coupled to the two select lines distinguish the NAND strings on the particular level from the NAND strings on the other levels of the plurality of levels.

4. The integrated circuit of claim 1, wherein threshold voltages of the switch transistors controlled by one of the plurality of select lines are from a quantity of switch threshold voltage levels, and the quantity of threshold voltage levels is equal to a square root of a number of levels in the plurality of levels of the three dimensional array.

5. The integrated circuit of claim 1, wherein the plurality of select lines includes four select lines, and the switch transistors electrically coupled to the four select lines distinguish NAND strings on the particular level from the NAND strings on the other levels of the plurality of levels.

6. The integrated circuit of claim 1, wherein threshold voltages of the switch transistors coupled to different select lines of the plurality of select lines are from corresponding sets of switch threshold voltage levels.

7. The integrated circuit of claim 1, wherein the plurality of select lines includes a first select line and a second select line,
the switch transistors include a first set of switch transistors electrically coupled to the first select line, and a second set of switch transistors electrically coupled to the second select line,
the NAND strings include memory cells in series with a first switch transistor from the first set of switch transistors, and a second switch transistor from the second set of switch transistors,
threshold voltages of the first set of switch transistors are from a first set of switch threshold voltage levels having a quantity of switch threshold voltage levels,
threshold voltages of the second set of switch transistors are from a second set of switch threshold voltage levels having the quantity of switch threshold voltage levels, and
a number of levels in the plurality of levels of the three dimensional array is equal to the quantity of switch threshold voltage levels.

8. The integrated circuit of claim 1, wherein the plurality of select lines includes a first select line, a second select line, a third select line, and a fourth select line,
the switch transistors include a first set of switch transistors electrically coupled to the first select line, a second set of switch transistors electrically coupled to the second select line, a third set of switch transistors electrically coupled to the third select line, and a fourth set of switch transistors electrically coupled to the fourth select line,
the NAND strings include memory cells in series with a first switch transistor from the first set of switch transistors, a second switch transistor from the second set of switch transistors, a third switch transistor from the third set of switch transistors, and a fourth switch transistor from the fourth set of switch transistors,
threshold voltages of the first set of switch transistors are from a first set of switch threshold voltage levels having a first quantity of switch threshold voltage levels,
threshold voltages of the second set of switch transistors are from a second set of switch threshold voltage levels having the first quantity of switch threshold voltage levels,
threshold voltages of the third set of switch transistors are from a third set of switch threshold voltage levels having a second quantity of switch threshold voltage levels,
threshold voltages of the fourth set of switch transistors are from a fourth set of switch threshold voltage levels having the second quantity of switch threshold voltage levels and
a number of levels in the plurality of levels of the three dimensional array is equal to a product of the first quantity of switch threshold voltage levels and the second quantity of threshold voltage levels.

9. The integrated circuit of claim 1, wherein the plurality of select lines includes a first select line and a second select line,
the switch transistors include a first set of switch transistors electrically coupled to the first select line, and a second set of switch transistors electrically coupled to the second select line,
the NAND strings include memory cells in series with a first switch transistor from the first set of switch transistors and a second switch transistor from the second set of switch transistors,
threshold voltages of the first set of switch transistors are paired with threshold voltages of the second set of switch transistors, a first threshold voltage of the first switch transistors on the particular level at an i-th threshold voltage level in a first set of N increasingly ordered threshold voltage levels, is paired with a second threshold voltage of the second switch transistors on the particular level at an i-th threshold voltage level in a second set of N decreasingly ordered threshold voltage levels.

10. The integrated circuit of claim 1, wherein the plurality of select lines includes a first select line, a second select line, a third select line, and a fourth select line,
the switch transistors include a first set of switch transistors electrically coupled to the first select line, a second set of switch transistors electrically coupled to the second select line, a third set of switch transistors electrically coupled to the third select line, and a fourth set of switch transistors electrically coupled to the fourth select line, the NAND strings include memory cells in series with a first switch transistor from the first set of switch transistors, a second switch transistor from the second set of switch transistors, a third switch transistor from the third set of switch transistors, and a fourth switch transistor from the fourth set of switch transistors, threshold voltages of the first set of switch transistors, the second set of switch transistors, the third set of switch transistors, and the fourth set of switch transistors are from corresponding sets of switch threshold voltage levels having N switch threshold voltage levels, and threshold voltages of the first set of switch transistors are paired with threshold voltages of the second set of switch transistors, such that the bias arrangement applied to the first select line and the second select line selects the NAND strings on a fraction (1/N) of the plurality of levels, threshold voltages of the third set of switch transistors are paired with threshold voltages of the fourth set of switch transistors, such that the bias arrangement applied to the third select line and the fourth select line selects the NAND strings on the fraction (1/N) of the plurality of levels, and an intersection of the NAND strings selected by the first select line and the second select line, and the NAND strings selected by the third select line and the fourth select line, selects the NAND strings on the particular level of the plurality of levels.

11. A method comprising:

selecting NAND strings including memory cells and switch transistors on a particular level of a plurality of levels of a three dimensional memory array, and deselecting NAND strings on other levels of the plurality of levels, by applying a bias arrangement to a plurality of select lines electrically coupled to the switch transistors having combinations of threshold voltage levels that vary across the plurality of levels.

12. The method of claim 11, wherein threshold voltages of the switch transistors controlled by one of the plurality of select lines are from a quantity of switch threshold voltage levels, and the quantity of threshold voltage levels is equal to a number of levels in the plurality of levels of the three dimensional array.

13. The method of claim 11, wherein the plurality of select lines includes two select lines, and the switch transistors electrically coupled to the two select lines distinguish the NAND strings on the particular level from the NAND strings on the other levels of the plurality of levels.

14. The method of claim 11, wherein threshold voltages of the switch transistors controlled by one of the plurality of select lines are from a quantity of switch threshold voltage levels, and the quantity of threshold voltage levels is equal to a square root of a number of levels in the plurality of levels of the three dimensional array.

15. The method of claim 11, wherein the plurality of select lines includes four select lines, and the switch transistors electrically coupled to the four select lines distinguish NAND strings on the particular level from the NAND strings on the other levels of the plurality of levels.

16. The method of claim 11, wherein threshold voltages of the switch transistors coupled to different select lines of the plurality of select lines are from corresponding sets of switch threshold voltage levels.

17. The method of claim 11, wherein the plurality of select lines includes a first select line and a second select line, the switch transistors include a first set of switch transistors electrically coupled to the first select line, and a second set of switch transistors electrically coupled to the second select line, the NAND strings include memory cells in series with a first switch transistor from the first set of switch transistors, and a second switch transistor from the second set of switch transistors, threshold voltages of the first set of switch transistors are from a first set of switch threshold voltage levels having a quantity of switch threshold voltage levels, threshold voltages of the second set of switch transistors are from a second set of switch threshold voltage levels having the quantity of switch threshold voltage levels, and a number of levels in the plurality of levels of the three dimensional array is equal to the quantity of switch threshold voltage levels.

18. The method of claim 11, wherein the plurality of select lines includes a first select line, a second select line, a third select line, and a fourth select line, the switch transistors include a first set of switch transistors electrically coupled to the first select line, a second set of switch transistors electrically coupled to the second select line, a third set of switch transistors electrically coupled to the third select line, and a fourth set of switch transistors electrically coupled to the fourth select line, the NAND strings include memory cells in series with a first switch transistor from the first set of switch transistors, a second switch transistor from the second set of switch transistors, a third switch transistor from the third set of switch transistors, and a fourth switch transistor from the fourth set of switch transistors, threshold voltages of the first set of switch transistors are from a first set of switch threshold voltage levels having a first quantity of switch threshold voltage levels, threshold voltages of the second set of switch transistors are from a second set of switch threshold voltage levels having the first quantity of switch threshold voltage levels, threshold voltages of the third set of switch transistors are from a third set of switch threshold voltage levels having a second quantity of switch threshold voltage levels, threshold voltages of the fourth set of switch transistors are from a fourth set of switch threshold voltage levels having the second quantity of switch threshold voltage levels and a number of levels in the plurality of levels of the three dimensional array is equal to a product of the first quantity of switch threshold voltage levels and the second quantity of threshold voltage levels.

19. The method of claim 11, wherein the plurality of select lines includes a first select line and a second select line, the switch transistors include a first set of switch transistors electrically coupled to the first select line, and a second set of switch transistors electrically coupled to the second select line, the NAND strings include memory cells in series with a first switch transistor from the first set of switch transistors and a second switch transistor from the second set of switch transistors, threshold voltages of the first set of switch transistors are paired with threshold voltages of the second set of switch transistors, a first threshold voltage of the first switch transistors on the particular level at an i-th threshold voltage level in a first set of N increasingly ordered threshold voltages, is paired with a second threshold voltage of the second switch transistors on the particular level at an i-th threshold voltage level in a second set of N decreasingly ordered threshold voltage levels.

20. The method of claim 11, wherein the plurality of select lines includes a first select line, a second select line, a third select line, and a fourth select line, the switch transistors include a first set of switch transistors electrically coupled to the first select line, a second set of switch transistors electrically coupled to the second select line, a third set of switch transistors electrically coupled to the third select line, and a fourth set of switch transistors electrically coupled to the fourth select line, the NAND strings include memory cells in series with a first switch transistor from the first set of switch transistors, a second switch transistor from the second set of switch transistors, a third switch transistor from the third set of switch transistors, and a fourth switch transistor from the fourth set of switch transistors, threshold voltages of the first set of switch transistors, the second set of switch transistors, the third set of switch transistors, and the fourth set of switch transistors are from corresponding sets of switch threshold voltage levels having N switch threshold voltage levels, and threshold voltages of the first set of switch transistors are paired with threshold voltages of the second set of switch transistors, such that the bias arrangement applied to the first select line and the second select line selects the NAND strings on a fraction (1/N) of the plurality of levels, threshold voltages of the third set of switch transistors are paired with threshold voltages of the fourth set of switch transistors, such that the bias arrangement applied to the third select line and the fourth select line selects the NAND strings on the fraction (1/N) of the plurality of levels, and an intersection of the NAND strings selected by the first select line and the second select line, and the NAND strings selected by the third select line and the fourth select line, selects the NAND strings on the particular level of the plurality of levels.

* * * * *